United States Patent
Yuyama et al.

(10) Patent No.: US 6,620,513 B2
(45) Date of Patent: Sep. 16, 2003

(54) BASE SHEET FOR FLEXIBLE PRINTED CIRCUIT BOARD

(75) Inventors: Masahiro Yuyama, Ibaraki-ken (JP); Hitoshi Arai, Ibaraki-ken (JP); Yoshitsugu Eguchi, Ibaraki-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/897,225

(22) Filed: Jul. 2, 2001

(65) Prior Publication Data

US 2002/0012780 A1 Jan. 31, 2002

(30) Foreign Application Priority Data

Jul. 3, 2000 (JP) ........................................ 2000-200961

(51) Int. Cl.$^7$ ......................... B32B 27/38; B32B 27/00; B32B 27/30; H05K 1/00; H05K 1/03
(52) U.S. Cl. ....................... 428/416; 428/413; 428/414; 428/418; 428/473.5; 428/332; 428/522; 428/901; 174/254; 174/255; 174/256; 174/258; 174/259
(58) Field of Search ................................. 174/254, 255, 174/256, 257, 258, 259; 428/413, 414, 416, 418, 473.5, 332, 615, 686, 901, 522

(56) References Cited

U.S. PATENT DOCUMENTS

| 5,260,130 A | * 11/1993 | Sakaguchi et al. ..... 428/355 CN |
| 6,054,509 A | * 4/2000 | Arai et al. ................... 523/428 |
| 6,333,466 B1 | * 12/2001 | Miyaake et al. ............ 174/254 |
| 6,350,844 B1 | * 2/2002 | Ono et al. ................... 528/170 |

FOREIGN PATENT DOCUMENTS

| JP | 09208921 A | * 8/1997 | .......... C09J/163/00 |

* cited by examiner

*Primary Examiner*—Robert Dawson
*Assistant Examiner*—Michael J Feely
(74) *Attorney, Agent, or Firm*—Reed Smith LLP

(57) ABSTRACT

The subject matter of the invention is a base sheet for the preparation of a flexible printed circuit board which is a three-layered laminate consisting of (a) an electrically insulating film of a plastic resin such as a polyimide, (b) an epoxy resin-based adhesive layer and (c) a copper foil bonded to the film (a) with intervention of the adhesive layer (b). The base sheet can exhibit excellent performance in respect of peeling resistance, soldering heat resistance, dimensional stability and solvent resistance as well as workability into a printed circuit board only when each of the layers (a), (b) and (c) has a specified thickness in a narrow range of 10–30 $\mu$m, 5–15 $\mu$m and 5–15 $\mu$m, respectively.

4 Claims, No Drawings

BASE SHEET FOR FLEXIBLE PRINTED CIRCUIT BOARD

This application claims priority of Japanese Application No. 2000-200961 filed Jul. 3, 2000.

BACKGROUND OF THE INVENTION

The present invention relates to a base sheet for a flexible printed circuit board or, more particularly, to a multiple-layered sheet material used for the preparation of a flexible printed circuit board.

As is known, a base sheet for a flexible printed circuit board is a multiple-layered laminated sheet material comprising an electrically insulating film of a plastic resin and a metal foil, e.g., copper foil, adhesively bonded to one surface of the insulating plastic resin film either directly or with intervention of an adhesive layer therebetween. A flexible printed circuit board is prepared by patterning the metal foil into the pattern of a desired electric wiring circuit. The patterned metal foil layer is usually protected by integrally laminating with a coverlay film made from a plastic resin film and an adhesive layer.

Along with the trend of various electronic instruments in recent years toward more and more compactness, lighter and lighter weight and higher and higher wiring density, flexible printed circuit boards are also required to be more and more upgraded in their properties and performance. To be in compliance with this trend, for example, flexible printed circuit boards are required to be improved relative to the interlayer adhesion, heat resistance, electric insulation and other properties. Namely, a flexible printed circuit board must have a greatly decreased weight, increased interlayer adhesion and good dimensional stability in order to accomplish finer and finer circuit patterning corresponding to the rapidly progressing recent trend toward a remarkably increased wiring density of the printed circuit board. While it is usual in the prior art that an insulating plastic resin film and a metal foil are laminated by using an adhesive such as epoxy resin/acrylic resin-based adhesives, epoxy resin/NBR-based adhesives and epoxy resin/polyester resin-based adhesives as well as polyimide-based adhesives for an increased fineness of the circuit pattern, development works are now proceeding for a two-layered base sheet for flexible printed circuit boards by directly laminating a polyimide resin film and a copper foil adhesively laminated without intervention of an adhesive layer therebetween.

In each of the above described methods by using an adhesive, one of the most conventional base ingredients in the adhesive is a so-called NBR having functional groups in the molecule because such an NBR-based adhesive exhibits excellent adhesive bonding strength. Disadvantageously, however, such an adhesive is poor in the dimensional stability not to be suitable in a base sheet material of high performance for flexible printed circuit boards when very fine circuit pattern of several tens of micrometers fineness is desired. it is therefore generally accepted heretofore in the base sheet for flexible printed circuit boards that the requirement for an excellent adhesive bonding strength and the requirement for good dimensional stability are incompatible each with the other. In the two-layer type base sheet without intervention of an adhesive layer, besides, a high adhesive bonding strength between layers can be accomplished only by undertaking a complicated surface treatment of the layers and consequently resulting in great difficulties and very high costs for obtaining a high adhesive bonding strength with reproducibility.

SUMMARY OF THE INVENTION

In view of the above described problems and disadvantages in the prior art, the present invention has an object to provide a high-performance three-layer type base sheet for flexible printed circuit boards in which an excellent adhesive bonding strength between layers can be obtained with good reproducibility. The present invention has been completed on the base of an unexpected discovery that, in a three-layered base sheet for flexible printed circuit boards, the most important requirement for obtaining a high-performance base sheet is that each of the layers has a specified thickness.

Thus, the present invention provides a base sheet for flexible printed circuit boards comprising (a) an electrically insulating base film of a plastic resin, (b) a layer of an adhesive formed on one surface of the base film (a) and (c) a foil of copper adhesively bonded to the base film (a) with intervention of the adhesive layer (b), in which the base film (a) has a thickness in the range from 10 to 30 $\mu$m, the adhesive layer (b) has a thickness in the range from 5 to 15 $\mu$m and the copper foil (c) has a thickness in the range from 5 to 15 $\mu$m.

DETAILED DESCRIPTION OF THE PREFERRED EMBODIMENTS

As is described above, the most characteristic feature in the inventive three-layered base sheet for flexible printed circuit boards is that each of the layers has a thickness within the specified range.

Namely, the electrically insulating film (a) of a plastic resin has a thickness in the range from 10 to 30 $\mu$m. When the thickness of the plastic resin film (a) is too small, a great decrease is caused in the mechanical properties of the three-layered base sheet prepared by using the same resulting in a decrease of the workability in the preparation of the base sheet and circuit patterning. When the thickness of the film (a) is too large, on the other hand, the flexibility of the three-layered base sheet thereof is unduly decreased.

The electrically insulating plastic resin of the film (a) is preferably selected from polyimide resins, polyester resins and polyphenylene sulfide resins of which polyimide resins are more preferable though not particularly limitative thereto. As to the mechanical properties of the plastic resin or the polyimide resin, it is desirable that the plastic resin film has an elastic modulus in the range from 3.0 to 8.0 GPa or, preferably, from 3.8 to 8.0 GPa or, more preferably, from 4.0 to 6.0 GPa. When the elastic modulus of the polyimide resin is too low, the plastic resin film (a) is poor in the dimensional stability eventually to cause undue shrinkage while, when the elastic modulus is too high, the plastic resin film is too rigid and sometimes brittle resulting in a decreased flexibility of the three-layered base sheet. Though optional, the surface of the plastic resin film (a) can be subjected to a surface treatment by utilizing low temperature plasma, corona discharging, sand blasting and the like with an object to improve adhesion with the adhesive layer (b) formed thereon.

A conventional process for the preparation of a polyimide resin film is that a film of a polyamide resin prepared by the reaction of an aromatic dicarboxylic acid dianhydride and an aromatic diamine compound is subjected to a thermal or chemical dehydrating imidation reaction. The mechanical properties including the elastic modulus of the polyimide resin film can be controlled by adequately selecting the combination of the aromatic dicarboxylic acid dianhydride and aromatic diamine compound as the starting reactants.

For example, a polyimide resin film having an elastic modulus in the range from 3.8 to 8.0 GPa can be obtained by using pimellitic acid dianhydride as the aromatic dicarboxylic acid dianhydride and a combination of 4,4'-diaminodiphenyl ether and 1,4-phenylene diamine in a weight ratio of 90:10 to 40:60 as the aromatic diamine reactant although any polyimide films produced by a conventional method can be used in the present invention.

Typically, 4,4'-diaminodiphenyl ether and 1,4-phenylene diamine are dissolved in a weight ratio of 90:10 to 40:60 in a polar organic solvent such as N,N-dimethylformamide, N,N-dimethylacetamide and N-methyl-2-pyrrolidone to give a solution of a total solid concentration of 5 to 30% by weight and, while the solution is kept at a temperature of 0 to 30° C. under an atmosphere of an inert gas such as nitrogen, the aromatic dicarboxylic acid dianhydride in a stoichiometric amount is added to the solution followed by continued agitation of the solution for 1 to 10 hours to give a solution of a polyamidoacid resin. The resin solution is spread over a flat and smooth surface of a casting plate and, after evaporation of the solvent, subjected to a heat treatment at 90 to 120° C. for 5 to 60 minutes to give a film of a partially imidated polyamidoacid resin in the form of a self-supporting film. This film spread over and fixed to a frame is subjected to a heat treatment at 150 to 200° C. for 30 to 90 minutes to completely remove the solvent and then further subjected to a heat treatment at 300 to 450° C. for 1 to 90 minutes to effect complete imidation of the resin giving a finished polyimide resin film which can be used in the present invention. When the dehydration imidation reaction of the polyamidoacid resin film is performed chemically, an aliphatic carboxylic acid anhydride, e.g., acetic anhydride, as a dehydrating agent and a nitrogen-containing organic compound, e.g., isoquinoline, as a dehydration catalyst are admixed thereto to give a completely imidated polyimide resin film. The elastic modulus of the thus obtained polyimide resin film can be determined, for example, by the method specified in ASTM D 882.

The copper foil (c) to be laminated with the surface of the above described electrically insulating plastic resin film with intervention of an adhesive layer (b) therebetween has a thickness in the range from 5 to 15 $\mu$m or, preferably, from 6 to 14 $\mu$m. When the thickness of the copper foil (c) is too small, the copper foil (c) is so fragile that the workability in the preparation of the three-layered base sheet and circuit patterning of the copper foil is unduly decreased while, when the thickness thereof is too large, the cross sectional profile of the patterned copper foil can hardly be orthogonal with sharply edged shoulder lines so that the three-layered base sheet is not suitable for the preparation of a flexible printed circuit board having fineness of copper foil patterning finer than 100 $\mu$m of width. The copper foil is not particularly limitative relative to the types such as rolled copper foils and electrolytic copper foils which should be selected depending on the particularly intended application of the flexible printed circuit board.

The layer of an adhesive (b) which intervenes between the electrically insulating film (a) and the copper foil (c) has a thickness in the range from 5 to 15 $\mu$m or, preferably, from 6 to 10 $\mu$m. When the thickness of the adhesive layer (b) is too small, adhesive bonding between the layers (a) and (c) can hardly be complete while, when the thickness of the adhesive layer (b) is too large, a decrease is caused in the dimensional stability of the three-layered base sheet. The overall thickness of the base sheet for flexible printed circuit boards constituted of the layers (a), (b) and (c) is in the range from 20 to 60 $\mu$m or, preferably, from 20 to 50 $\mu$m. When the overall thickness of the base sheet is too small, a sufficiently high mechanical strength cannot be imparted to the base sheet while, when the overall thickness thereof is too large, a decrease is caused in the dimensional stability of the base sheet along with problems relative to the requirements for space saving in the electronic instruments and fineness of circuit patterning in the flexible printed circuit boards.

Various kinds of adhesives can be used in the inventive base sheet for flexible printed circuit boards including epoxy resin/NBR-based adhesives, epoxy resin/acrylic resin-based adhesives, epoxy resin/polyester-based adhesives, epoxy resin/nylon-based adhesives, phenolic resin/NBR-based adhesives, phenolic resin/nylon-based adhesives and the like.

In order for the inventive base sheet for flexible printed circuit boards to be suitable for very fine circuit patterning of the copper foil without affecting other properties including high dimensional stability, it is important to employ an adhesive having adequate properties. A preferable adhesive composition in this regard is that consisting of 100 parts by weight of (A) an epoxy resin having at least two epoxy groups in a molecule, from 30 to 100 parts by weight of (B) a nitrile rubber composition, from 1 to 30 parts by weight of (C) a curing agent for the epoxy resin and from 0.1 to 3 parts by weight of (D) a curing accelerator selected from the group consisting of imidazole compounds, tertiary amine tetraboric acid salts, borofluoride compounds and octoic acid esters, the nitrile rubber composition as the component (B) preferably comprising (B1) a nitrile rubber having carboxyl groups in the molecule and (B2) a nitrile rubber free from functional groups and containing from 25 to 45% by weight of the acrylonitrile moiety in a compounding ratio (B1):(B2) in the range from 95:5 to 55:45 by weight.

The epoxy resin as the component (A) in the adhesive composition used in the invention having at least two epoxy groups in a molecule is exemplified by bisphenol A-based epoxy resins, bisphenol F-based epoxy resins, phenol novolak-based epoxy resins, alicyclic epoxy resins and glycidylamine-based epoxy resins as well as those halogenated epoxy resins derived from these epoxy resins. Several commercial epoxy resins can be used for the purpose including Epikotes 828, 5050, 5049, 5048, 5045, 154, 604 and 1001 (each a product by Yuka Shell Co.), Sumiepoxys ELA115, ELA127, ESCN195XL, ELM120 and ESB400 (each a product by Sumitomo Chemical Co.), BREN-195X (a product by Nippon Kayaku Co.) and EP-4100 (a product by Asahi Denka Co.).

The NBR, i.e. acrylonitrile/butadiene copolymeric rubber, used in the invention is a combination of (B1) a first NBR having carboxyl groups in the molecule and (B2) a second NBR free from functional groups. When the weight proportion of the first NBR to the second NBR is too high, a decrease is caused in the dimensional stability of the base sheet product not to be suitable for fine circuit patterning while, when the weight proportion is too low, a decrease is caused in the electric properties thereof. When the amount of the NBR in the adhesive composition is too small, the adhesive composition cannot exhibit full adhesive strength while, when the amount is too large, the adhesive composition suffers a decrease in the heat resistance and electric properties.

The above mentioned first NBR having carboxyl groups in the molecule is, for example, a copolymer of acrylonitrile and butadiene carboxylated at the molecular terminals or a copolymer of acrylonitrile, butadiene and a monomer having a carboxyl group in the molecule. Several commercial NBR products of this type are available and can be used in the present invention including Nipoles 1072J, 1072B, DN631 and DN601 (each a product by Nippon Zeon Co.). Commercial products of the NBR free from functional groups in the molecule, which preferably contain from 25 to 45% by weight of acrylonitrile moiety in respect of good adhesive strength and solvent resistance, include Nipoles 1031, 1032, 1001, DN225, DN1041, DN1042 and 1043 and Zetpoles 2000, 2020 and 3110 (each a product by Nippon Zeon Co.).

The curing agent compounded in the adhesive composition is not particularly limitative and any of known ones can be used including aliphatic amine compounds, alicyclic amine compounds, aromatic amine compounds, acid anhydride compounds, dicyandiamide, boron trifluoride/amine complexes and the like. The amount of the curing agent in the adhesive composition is in the range from 1 to 30 parts by weight or, preferably, from 5 to 20 parts by weight per 100 parts by weight of the epoxy resin. When the amount of the curing agent is too small, the epoxy resin cannot be fully cured not to exhibit good properties such as solvent resistance and electric properties while, when the amount thereof is too large, the cured adhesive composition suffers a decrease in the adhesive strength and soldering resistance.

The curing accelerator compounded in the adhesive composition is exemplified by imidazole compounds such as 2-alkyl-4-methyl imidazoles, tertiary amine tetraphenyl borates such as triethyleneammonium triphenyl borate, borofluoride compounds such as zinc borofluoride, tin borofluoride and nickel borofluoride and metal octoates such as tin octoate and zinc octoate. These curing accelerators can be used either singly or as a combination of two kinds or more but metal octoates and borofluoride compounds are preferable among the above named various compounds. The amount of the curing accelerator compounded in the adhesive composition is in the range from 0.1 to 3 parts by weight or, preferably, from 0.3 to 2 parts by weight per 100 parts by weight of the epoxy resin. When the amount of the curing accelerator is too small, an unduly long time is taken for complete curing of the adhesive composition so that curing of the adhesive composition is sometimes incomplete resulting in a decrease in the migration resistance, electric properties and solvent resistance while, when the amount thereof is too large, workability of the adhesive composition is decreased due to shortened pot life of the composition along with a decrease in the mechanical properties and soldering resistance of the cured adhesive composition.

In addition to the above described essential ingredients, the adhesive composition used in the invention can optionally be compounded with various kinds of known additives including phenolic resins, zinc oxide to exhibit curing controlling effect, flame retardants such as organic halogen compounds, antimony trioxide, aluminum hydroxide and silicon dioxide each in a limited amount.

The above described adhesive composition can be diluted by adding a limited volume of an organic solvent with an object to facilitate application works of the composition onto a substrate surface. Examples of suitable organic solvents include methanol, ethanol, isopropyl alcohol, acetone, methyl ethyl ketone, toluene, trichloroethylene, 1,4-dioxane, 1,3-dioxane, dioxolane and the like. The amount of the organic solvent in the adhesive composition after dilution is such that the solid content of the diluted composition is in the range from 10 to 45% by weight or, preferably, from 20 to 35% by weight. When the solid content is too high, the adhesive composition suffers a decrease in the coating workability due to insufficient decrease in the viscosity or consistency while, when the solid content is too low, difficulties are encountered in accomplishing uniformity in coating if not to mention the problem of environmental pollution due to an increased amount of solvent evaporation and economical disadvantages. Addition of the organic solvent to the adhesive composition can be performed by using a pot mill, ball mill, roll mill, homogenizer, super mill and the like.

While it is a trend in recent years that the base sheet for flexible printed circuit boards is required to be suitable for more and more increasing fineness of circuit patterning of the copper foil along with the rapidly progressing compactness of electronic instruments which can be accomplished with high dimensional stability of the base sheet, a quantitative evaluation of the dimensional stability can be given by the equation described later in connection with the Examples. In order to give a fine circuit patterning with a line width of several tens of micrometers, for example, the base sheet is required to have dimensional stability of −0.1% to +0.1% or, desirably, from −0.03% to +0.03% according to the above mentioned quantitative criteria.

Following is a description of an exemplary procedure for the preparation of the inventive base sheet for the preparation of flexible printed circuit boards. In the first place, an electrically insulating plastic resin film is uniformly coated by using a suitable coating machine such as a reverse roll coater and comma coater with an adhesive solution prepared by diluting the above described adhesive composition with an organic solvent. The thus coated film is continuously passed through an in-line dryer where the coating layer is heated at 80 to 140° C. for 2 to 10 minutes so that the solvent in the coating layer is removed by evaporation to give an adhesive layer in a semi-cured state. Thereafter, the plastic film bearing the semi-cured adhesive layer is laminated with a copper foil in a hot laminating roller at a temperature of 60 to 150° C. under a linear roll pressure of 2 to 200 N/cm. If necessary, the thus laminated film is subjected to a further heat treatment at a temperature of 80 to 200° C. for 1 minute to 24 hours in order to effect complete curing of the adhesive layer.

While the above description is given of the preparation of a base sheet for a flexible single-side printed circuit board, a similar procedure is applicable to the preparation of a base sheet for a flexible double-side printed circuit board in which the insulating plastic resin film is sandwiched with two copper foils each with intervention of an adhesive layer.

When the electrically insulating resin film has the above specified elastic modulus and each of the three layers has the above specified thickness, good balance of mechanical behavior is obtained among the respective layers of the base sheet so that the base sheet can be imparted with greatly improved dimensional stability suitable for the preparation of a flexible printed circuit board of extremely fine circuit patterning having an interline distance not exceeding 50 μm or even finer required in modern flexible printed circuit boards used in very compact electronic instruments.

In the following, Examples are given to illustrate the inventive base sheet for flexible printed circuit boards in more detail although the scope of the present invention is never limited by these Examples.

In the following Examples and Comparative Examples, evaluation of the base sheets for flexible printed circuit boards was made for the following items given below by the respective testing methods specified there.

Peeling resistance of copper foil: Measurements were made according to the procedure specified in JIS C 6481 by using a sample sheet of which the copper foil was patterned in a circuit wiring pattern having a line width of 1 mm and the copper foil was peeled off from the resin film by pulling in a 90° direction at a pulling velocity of 50 mm/minute to record the force required for peeling.

Soldering resistance: Measurements were made according to the procedure specified in JIS C 6481 in which a 25 mm square piece of the sample sheet was kept floating for 30 seconds on a solder alloy melt at a varied temperature and records were made of the highest temperature of the solder alloy melt at which no blistering nor lifting of the copper foil was detected.

Dimensional stability: Measurements were made according to the procedure specified in IPC FC 241 in which the sample sheet was subjected to a heat treatment at 150° C. for 30 minutes and calculation was made from the lengths of the sheet before and after the heat treatment ($L_0$ and $L_1$, respectively) in the machine direction from the equation:

Dimensional stability, $\% = 100 \times (L_1 - L_0)/L_0$.

Solvent resistance: A 1 mm wide strip of the sample sheet was kept immersed for 10 minutes in toluene at 70° C. and then immediately subjected to the peeling resistance test according to (1) above.

Adaptability to printed circuit board preparation: The copper foil was patterned by etching in the form of a comb having an interline distance of 50 μm and the cross sectional profile of the patterned copper foil was examined under a magnifying lens to record completeness of etching in three ratings of: A for absence of noticeable incompleteness of etching; B for partial incompleteness of etching; and C for unacceptable incompleteness of etching.

Elastic modulus: Measurements were made according to the procedure specified in ASTM D 882 at 25° C.

In the following Examples, three kinds of epoxy resin-based adhesive compositions, referred to as the adhesives A, B and C hereinafter, were prepared according to the following formulations.

Adhesive A was prepared by blending 100 g of an epoxy resin (Epikote 5045, supra) with 56 g of a carboxyl group-containing first NBR (Nipole 1072, supra), 10 g of a second NBR free from functional groups (Nipole 1001, supra), 14 g of DDM (4,4'-diaminodiphenyl methane) as the curing agent, 2 g of tin octoate as the curing accelerator and 10 g of aluminum hydroxide as the flame retardant.

Adhesive B was prepared by blending 100 g of an epoxy resin (Epikote 5050, supra) with 45 g of a carboxyl group-containing first NBR (Nipole 1072, supra), 15 g of a second NBR free from functional groups (Nipole 1032, supra), 10 g of DDS (4,4'-diaminodiphenyl sulfone) as the curing agent, 1.0 g of tin borofluoride $Sn(BF_4)_2$ as the curing accelerator and 10 g of aluminum hydroxide as the flame retardant.

Adhesive C was prepared by blending 100 g of an epoxy resin (Epikote 5050, supra) with 120 g of a carboxyl group-containing first NBR (Nipole 1072, supra), 15 g of DDS as the curing agent, 1.2 g of tin borofluoride $Sn(BF_4)_2$ as the curing accelerator and 10 g of aluminum hydroxide as the flame retardant.

EXAMPLE 1

The adhesive A prepared above was dissolved in 500 g of methyl ethyl ketone by agitation to give an adhesive solution having a solid content of 28% by weight. A 200 mm by 200 mm wide polyimide resin film of 25 μm thickness (Kapton, a product by Toray Du Pont Co.) having an elastic modulus of 3.5 GPa was coated with the adhesive solution in a coating amount to give a 10 μm thick adhesive layer after drying and heated in an in-line dryer at 120° C. for 10 minutes to effect semi-curing of the adhesive composition. A 200 mm by 200 mm wide copper foil of 14 μm thickness (JTC ⅓ oz. electrolytic copper foil, a product by Japan Energy Co.) was laminated onto the thus semi-cured adhesive layer on the polyimide resin film by using a roller laminater at a temperature of 100° C. in a line speed of 2 meters per minutes under a linear pressure of 100 N/cm and the thus obtained laminate was subjected to a heat treatment at 170° C. for 3 hours to give a base sheet for flexible printed circuit boards having an overall thickness of 49 μm by complete curing of the adhesive layer which was subjected to the evaluation tests to give the results shown in Table 1 below.

EXAMPLE 2

The procedure for the preparation of a base sheet for flexible printed circuit boards was substantially the same as in Example 1 except that the adhesive A in Example 1 was replaced with the adhesive B and the adhesive layer had a thickness of 8 μm as dried so that the base sheet as prepared had an overall thickness of 47 μm. The results of the evaluation tests of this base sheet are shown in Table 1.

EXAMPLE 3

The procedure for the preparation of a base sheet for flexible printed circuit boards was substantially the same as in Example 1 except that the Kapton film of 25 μm thickness used in Example 1 was replaced with a polyimide resin film of another grade (Apical, a product by Kanegafuchi Chemical Co.) of 13 μm thickness having an elastic modulus of 3.2 GPa and the layer of the adhesive A had a thickness of 6 μm as dried so that the base sheet as prepared had an overall thickness of 33 μm. The results of the evaluation tests of this base sheet are shown in Table 1.

EXAMPLE 4

The procedure for the preparation of a base sheet for flexible printed circuit boards was substantially the same as in Example 1 except that the adhesive A in Example 1 was replaced with the adhesive B to give an adhesive layer of 10 μm thickness as dried and the copper foil had a thickness of 10 μm so that the base sheet as prepared had an overall thickness of 45 μm. The results of the evaluation tests of this base sheet are shown in Table 1.

EXAMPLE 5

The procedure for the preparation of a base sheet for flexible printed circuit boards was substantially the same as in Example 3 except that the polyimide resin film was the same one as used in Example 3, the adhesive layer of the adhesive A had a thickness of 12 μm as dried and the copper foil had a thickness of 10 μm and the copper foil had a thickness of 10 μm so that the base sheet as prepared had an overall thickness of 35 μm. The results of the evaluation tests of this base sheet are shown in Table 1.

EXAMPLE 6

The procedure for the preparation of a base sheet for flexible printed circuit boards was substantially the same as in Example 1 except that the polyimide resin film of Kapton (supra) had a thickness of 12.5 μm and the adhesive A in Example 1 was replaced with the adhesive C to give an adhesive layer of 8 μm thickness as dried so that the base sheet as prepared had an overall thickness of 34.5 μm. The results of the evaluation tests of this base sheet are shown in Table 1.

EXAMPLE 7

A polyimide resin film was prepared in the following manner. Thus, 4,4'-diaminodiphenyl ether and 1,4-phenylene diamine in a weight proportion of 50:50 were dissolved in dimethylformamide in an atmosphere of nitrogen and the solution kept at 25° C. was gradually admixed with pyromellitic acid dianhydride in an overall amount stoichiometrically equimolar to the aromatic diamine compounds followed by continued agitation of the solution for 3 hours at the same temperature to give a polyamidoacid solution. This solution was applied onto a glass plate by using an applicator in a coating amount to give a film thickness of 25 μm after drying and the coating layer on the glass plate was heated at 110° C. for 1 hour to evaporate the solvent. The thus obtained polyamidoacid resin film taken off the glass plate by peeling was spread over and fixed to a steel frame in a slack-free fashion and subjected to a heat treatment at 350° C. for 1 hour to effect dehydration imidation of the resin giving a polyimide resin film having an elastic modulus of 4.5 GPa.

The procedure for the preparation of a base sheet for flexible printed circuit boards was substantially the same as in Example 1 except that the polyimide resin film of Kapton (supra) was replaced with the 25 μm thick polyimide resin film prepared above to give a base sheet having an overall thickness of 49 μm. The results of the evaluation tests of this base sheet are shown in Table 1.

EXAMPLE 8

The procedure for the preparation of a base sheet for flexible printed circuit boards was substantially the same as in Example 7 except that the adhesive A in Example 7 was replaced with the adhesive C to give a 10 μm thick adhesive layer as dried so that the base sheet as prepared had an overall thickness of 49 μm. The results of the evaluation tests of this base sheet are shown in Table 1.

Comparative Example 1

The procedure for the preparation of a base sheet for flexible printed circuit boards was substantially the same as in Example 1 except that the polyimide resin (Kapton, supra) film of 25 μm thickness was replaced with another Kapton film of 50 μm thickness so that the base sheet as prepared had an overall thickness of 74 μm. The results of the evaluation tests of this base sheet are shown in Table 1.

Comparative Example 2

The procedure for the preparation of a base sheet for flexible printed circuit boards was substantially the same as in Example 1 except that the adhesive layer of the adhesive A had a thickness of 18 μm so that the base sheet as prepared had an overall thickness of 57 μm. The results of the evaluation tests of this base sheet are shown in Table 1.

Comparative Example 3

The procedure for the preparation of a base sheet for flexible printed circuit boards was substantially the same as in Example 1 except that the adhesive layer of the adhesive A had a thickness of 4 μm so that the base sheet as prepared had an overall thickness of 43 μm. The results of the evaluation tests of this base sheet are shown in Table 1.

Comparative Example 4

The procedure for the preparation of a base sheet for flexible printed circuit boards was substantially the same as in Example 1 except that the 25 μm thick Kapton film was replaced with another Kapton film of 13 μm thickness, the adhesive A was replaced with the adhesive B and the copper foil had a thickness of 35 μm so that the base sheet as prepared had an overall thickness of 58 μm. The results of the evaluation tests of this base sheet are shown in Table 1.

Comparative Example 5

The procedure for the preparation of a base sheet for flexible printed circuit boards was substantially the same as in Example 1 except that the 25 μm thick Kapton film was replaced with an Apical film of 13 μm thickness and the copper foil had a thickness of 18 μm so that the base sheet as prepared had an overall thickness of 41 μm. The results of the evaluation tests of this base sheet are shown in Table 1.

TABLE 1

|  | Peeling resistance, N/cm | Soldering resistance, ° C. | Dimensional stability, % | Solvent resistance, N/cm | Printed circuit board |
|---|---|---|---|---|---|
| Example |  |  |  |  |  |
| 1 | 14 | 330 | −0.06 | 8 | A |
| 2 | 13 | 330 | −0.06 | 7 | A |
| 3 | 11 | 330 | −0.05 | 6 | A |
| 4 | 12 | 330 | −0.06 | 7 | A |
| 5 | 12 | 330 | −0.06 | 7 | A |
| 6 | 14 | 330 | −0.09 | 10 | A |
| 7 | 14 | 330 | +0.02 | 8 | A |
| 8 | 14 | 330 | −0.02 | 9 | A |
| Comparative Example |  |  |  |  |  |
| 1 | 12 | 330 | −0.09 | 6 | A |
| 2 | 13 | 330 | −0.10 | 7 | A |
| 3 | 7 | 330 | −0.04 | 3 | A |
| 4 | 13 | 330 | −0.06 | 7 | C |
| 5 | 12 | 330 | −0.07 | 7 | B |

What is claimed is:

1. A base sheet for flexible printed circuit boards which is a three-layered laminate consisting of:
   (a) an electrically insulating film of a polyimide resin film having an elastic modulus in the range from 3.8 to 8.0 GPa and a thickness in the range from 10 to 30 μm;
   (b) a layer of an adhesive having a thickness in the range from 5 to 15 μm formed on at least one surface of the electrically insulating film (a); and
   (c) a copper foil having a thickness in the range from 5 to 15 μm adhesively bonded to the electrically insulating film (a) with intervention of the adhesive layer (b) therebetween.

2. The base sheet for flexible printed circuit boards as claimed in claim 1 in which the adhesive forming the adhesive layer is a composition which comprises:
   (A) 100 parts by weight of an epoxy resin having at least two epoxy groups in a molecule;
   (B) from 30 to 100 parts by weight of a nitrile rubber;
   (C) from 1 to 30 parts by weight of a curing agent for the epoxy resin; and
   (D) from 0.1 to 3 parts by weight of a curing accelerator selected from the group consisting of imidazole compounds, tertiary amine tetrafluoroborates, borofluoride compounds and metal salts of octoic acid.

3. The base sheet for flexible printed circuit boards as claimed in claim 2 in which the nitrile rubber as the component (B) is a combination of (B1) a first nitrile rubber having carboxyl groups in the molecule and (B2) a second nitrile rubber free from functional groups and containing from 25 to 45% by weight of acrylonitrile moiety in a weight proportion of (B1):(B2) in the range from 95:5 to 55:45.

4. The base sheet of claim 1, wherein the polyimide resin is a reaction product of an aromatic dicarboxylic acid dianhydride and an aromatic diamine; wherein said aromatic diamine comprises a combination of 4,4'-diaminodiphenyl ether and 1,4-phenylenediamine in a weight ratio in the range of 90:10 to 40:60.

* * * * *